US012648297B2

(12) United States Patent
Kim et al.

(10) Patent No.: US 12,648,297 B2
(45) Date of Patent: Jun. 2, 2026

(54) DISPLAY DEVICE AND MANUFACTURING METHOD THEREOF

(71) Applicant: Samsung Display Co., LTD., Yongin-si (KR)

(72) Inventors: Woong Sik Kim, Yongin-si (KR); Si Kwang Kim, Yongin-si (KR); Jin-Su Byun, Yongin-si (KR); Yu-Gwang Jeong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 352 days.

(21) Appl. No.: 18/338,514

(22) Filed: Jun. 21, 2023

(65) Prior Publication Data

US 2024/0032329 A1     Jan. 25, 2024

(30) Foreign Application Priority Data

Jul. 22, 2022     (KR) ........................ 10-2022-0091094

(51) Int. Cl.
| | |
|---|---|
| *H10K 50/86* | (2023.01) |
| *H10K 50/858* | (2023.01) |
| *B60K 35/00* | (2006.01) |
| *B60K 35/40* | (2024.01) |

(52) U.S. Cl.
CPC ........... *H10K 50/86* (2023.02); *H10K 50/858* (2023.02); *B60K 35/00* (2013.01); *B60K 35/425* (2024.01)

(58) Field of Classification Search
CPC ............................ H10K 50/86; H10K 50/858
USPC ................................................ 313/498–512
See application file for complete search history.

(56) References Cited

U.S. PATENT DOCUMENTS

| | | | |
|---|---|---|---|
| 2002/0097358 A1* | 7/2002 | Ueki ................. | G02F 1/133504 349/113 |
| 2010/0271721 A1 | 10/2010 | Gaides et al. | |
| 2020/0258946 A1* | 8/2020 | Kim ..................... | H10K 59/874 |
| 2021/0399260 A1* | 12/2021 | Kim .................. | H10K 59/8731 |
| 2022/0037414 A1 | 2/2022 | Kim et al. | |
| 2022/0085334 A1 | 3/2022 | Oh et al. | |
| 2022/0223653 A1* | 7/2022 | Kim ....................... | H10K 59/38 |
| 2025/0085586 A1* | 3/2025 | Kim .................. | G02F 1/133607 |

FOREIGN PATENT DOCUMENTS

| | | |
|---|---|---|
| JP | 2004-514167 | 5/2004 |
| KR | 10-2002-0037443 | 5/2002 |
| KR | 10-0406736 | 11/2003 |
| KR | 10-2014-0064220 | 5/2014 |
| KR | 10-2018-0084333 | 7/2018 |
| KR | 10-2020-0063591 | 6/2020 |

OTHER PUBLICATIONS

Extended European Search Report for European Application No. 23186575.9, dated Nov. 2, 2023.

* cited by examiner

*Primary Examiner* — Christopher M Raabe
(74) *Attorney, Agent, or Firm* — F. CHAU & ASSOCIATES, LLC

(57) ABSTRACT

A display device includes, a light emitting diode disposed on a substrate, and including an emission layer, an encapsulation layer disposed on the light emitting diode, a first layer disposed on the encapsulation layer and including an opening, a light blocking pattern disposed in the opening and extending in a first direction, and a second layer disposed on the first layer and the light blocking pattern. A refractive index of the first layer and a refractive index of the second layer are different from each other.

15 Claims, 19 Drawing Sheets

LED : EMLg, EMLr, EMLb (A)

DISPLAY DEVICE AND MANUFACTURING METHOD THEREOF

CROSS-REFERENCE TO RELATED APPLICATION(S)

This application claims priority to and benefits of Korean Patent Application No. 10-2022-0091094 under 35 U.S.C. § 119, filed in the Korean Intellectual Property Office on Jul. 22, 2022, the entire contents of which are incorporated herein by reference.

BACKGROUND

1. Technical Field

The disclosure relates to a display device and a manufacturing method thereof.

2. Description of the Related Art

A display device represents a device for displaying images on a screen, and such may be a liquid crystal display (LCD) or an organic light emitting diode display (OLED). A display device may be used in various electronic devices such as portable phones, GPSs, digital cameras, electronic books, portable game devices, and various terminals.

Further, a display device may be used in various fields in addition to electronic devices. For example, in the case of vehicles, conventional analog dashboards and center fascia may be replaced by display devices displaying digital data.

The above information disclosed in this Background section is only for enhancement of understanding of the background of the invention, and therefore it may contain information that does not form the prior art that is already known in this country to a person of ordinary skill in the art.

SUMMARY

The disclosure has been made in an effort to prevent light emitted by a display device from emitting in a specific direction.

The disclosure has been made in another effort to provide a uniform light blocking pattern.

The disclosure has been made in another effort to prevent light emitted by a display device used in a vehicle from being provided to eyes of a driver and hindering driver attention.

The disclosure has been made in another effort to prevent a display device used in a vehicle from being reflected on an entire surface of the glass of the vehicle and hindering sight of the driver at night.

An embodiment of the disclosure provides a display device that may include a light emitting diode disposed on a substrate, and including an emission layer, an encapsulation layer disposed on the light emitting diode, a first layer disposed on the encapsulation layer and including an opening, a light blocking pattern disposed in the opening and extending in a first direction, and a second layer disposed on the first layer and the light blocking pattern. A refractive index of the first layer and a refractive index of the second layer may be different from each other.

The opening may include a first opening and a second opening extended to each other, and an area of an upper portion of the first opening may be equal to or greater than an area of a lower portion of the second opening.

The light blocking pattern may include a first light blocking pattern disposed in the first opening, and a second light blocking pattern disposed in the second opening, and the first light blocking pattern and the second light blocking pattern may be integral with each other.

An upper side of the second light blocking pattern may have a concave shape.

Part of the second layer may be disposed in the second opening.

The refractive index of the first layer may be greater than the refractive index of the second layer.

The refractive index of the second layer may be greater than the refractive index of the first layer.

The light blocking pattern may include a first light blocking pattern disposed in the first opening, and part of the second layer may be disposed in the second opening.

The display device may further include a metal layer disposed in the second opening.

The metal layer may be formed on an internal side of the second opening.

The metal layer may include molybdenum.

Another embodiment of the disclosure provides a display device that may include a light emitting diode disposed on a substrate and including an emission layer, an encapsulation layer disposed on the light emitting diode, a first layer disposed on the encapsulation layer and including a first opening, a linear pattern disposed in the first opening and extending in a first direction, a light blocking pattern disposed on the linear pattern and extending in the first direction, and a second layer disposed on the first layer and the light blocking pattern. A refractive index of the first layer and a refractive index of the second layer may be different from each other.

The opening may include a first opening and a second opening extended to each other, the linear pattern may be disposed in the first opening, and the light blocking pattern may be disposed in the second opening.

An upper side of the light blocking pattern may be concave.

The refractive index of the first layer may be greater than the refractive index of the second layer.

The refractive index of the second layer may be greater than the refractive index of the first layer.

Another embodiment of the disclosure provides a method for manufacturing a display device. The method may include forming a first pattern on a substrate on which an encapsulation layer is formed, applying a first material layer on the first pattern, forming a first layer including an opening overlapping the first pattern by using a hard mask, and forming a second layer on the first layer, wherein at least part of the second layer fills the opening.

The first pattern may be a light blocking pattern, and the method may further include, after the forming of a first layer, forming a second light blocking pattern filling the opening by applying a light blocking material on the first layer and ashing the light blocking material.

The first pattern may be a light blocking pattern, and the method may further include, after the forming of a first layer, forming a metal layer in the opening.

The method may further include, after the forming of a first layer, forming a light blocking pattern for filling the opening by applying a light blocking material on the first layer and etching the light blocking material.

According to embodiments, the light blocking patterns may be formed on the entire surface of the emission layer in one direction so the light provided by the emission layer is not discharged in a specific direction. According to the embodiments, the form of the light blocking pattern may be uniformly provided.

Light emitted by the display device used in the vehicle may not be provided to the entire surface of the glass of the vehicle so the light reflected from the entire surface of the glass of the vehicle is prevented from hindering the sight of the driver. Light emitted by the display device positioned at or near the passenger seat may not be provided to the driver so driver attention is not hindered.

Compared to a comparative example in which a film-type light blocking pattern is formed at the entire surface of the emission layer, a light blocking pattern formed in the display device according to an embodiment provides merits. For example, there may be no problem of misalignment, the moiré phenomenon may be removed, thickness may be small, manufacturing cost may be reduced, and transmittance may be high.

BRIEF DESCRIPTION OF THE DRAWINGS

FIG. 19 schematically shows a cross-sectional structure of a display device according to an embodiment.

DETAILED DESCRIPTION OF THE EMBODIMENTS

Figure 1:
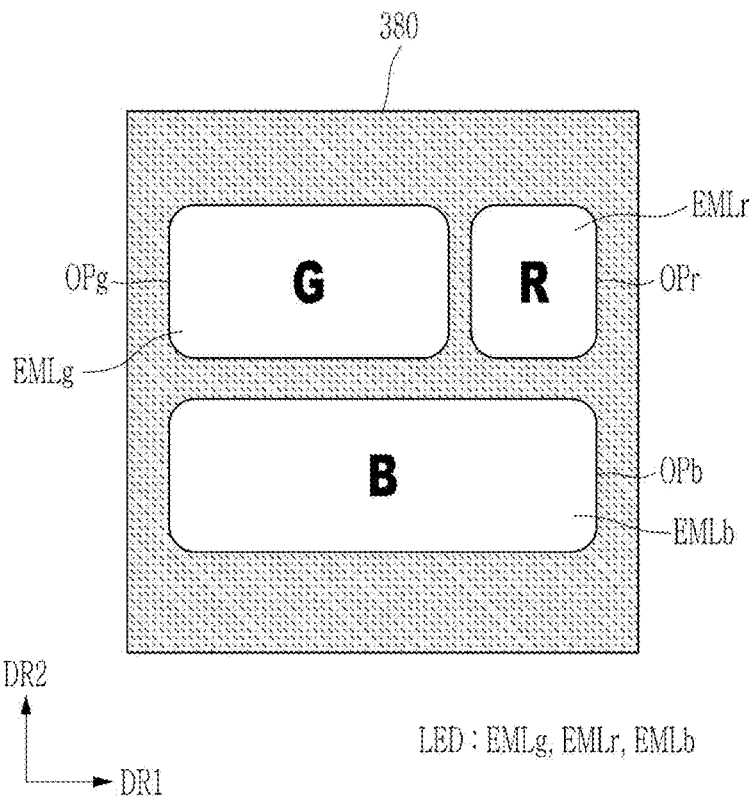
FIG. 1 schematically shows a plan view of a pixel of a display device according to an embodiment.

The disclosure will be described more fully hereinafter with reference to the accompanying drawings, in which embodiments are shown. As those skilled in the art would realize, the described embodiments may be modified in various different ways, all without departing from the spirit or scope of the disclosure.

Parts that are irrelevant to the description will be omitted to clearly describe the disclosure, and the same elements will be designated by the same reference numerals throughout the specification.

The size and thickness of each configuration shown in the drawings may be arbitrarily shown for better understanding and ease of description, but the disclosure is not limited thereto.

As used herein, the singular forms, "a," "an," and "the" are intended to include the plural forms as well, unless the context clearly indicates otherwise.

In the specification and the claims, the phrase "at least one of" is intended to include the meaning of "at least one selected from the group of" for the purpose of its meaning and interpretation. For example, "at least one of A and B" may be understood to mean any combination including "A, B, or A and B."

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

It will be understood that when an element such as a layer, film, region, or substrate is referred to as being "on" another element, it can be directly on the other element or intervening elements may also be present. In contrast, when an element is referred to as being "directly on" another element, there may be no intervening elements present. The word "on" or "above" means positioned on or below the object portion, and does not necessarily mean positioned on the upper side of the object portion based on a gravitational direction.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing an object portion, e.g., from the top, and the phrase "in a cross-sectional view" means viewing a cross-section of which the object portion is vertically cut, e.g., from the side.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or to "not overlap" another element, this may include that the elements are spaced apart from each other, offset from each other, or set aside from each other or any other suitable term as would be appreciated and understood by those of ordinary skill in the art.

"About" or "approximately" or "substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
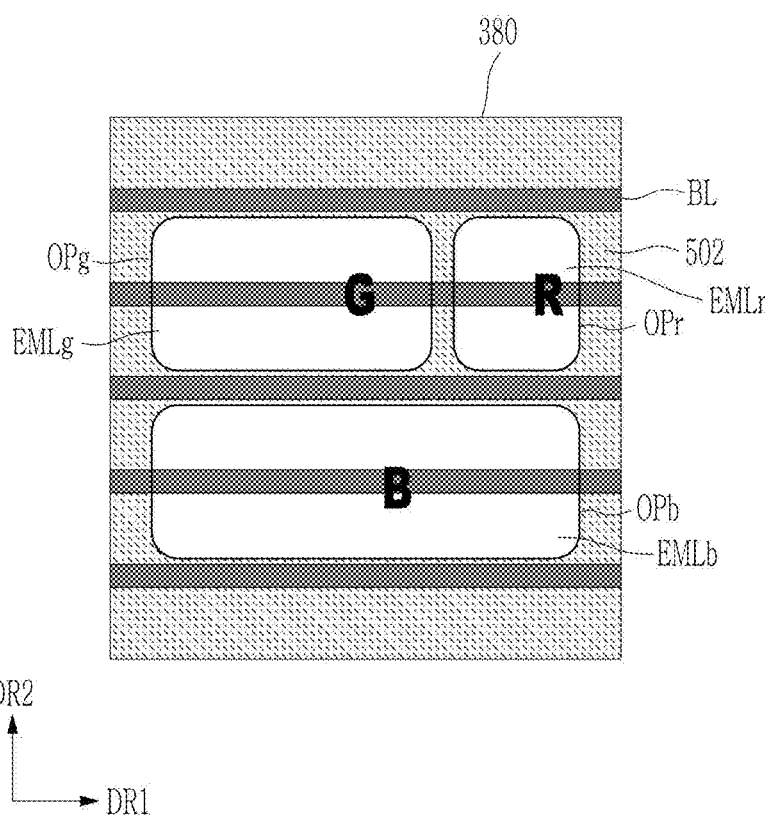
FIG. 3 schematically shows a plan view of a display device of FIG. 1 and FIG. 2.
Figure 4:
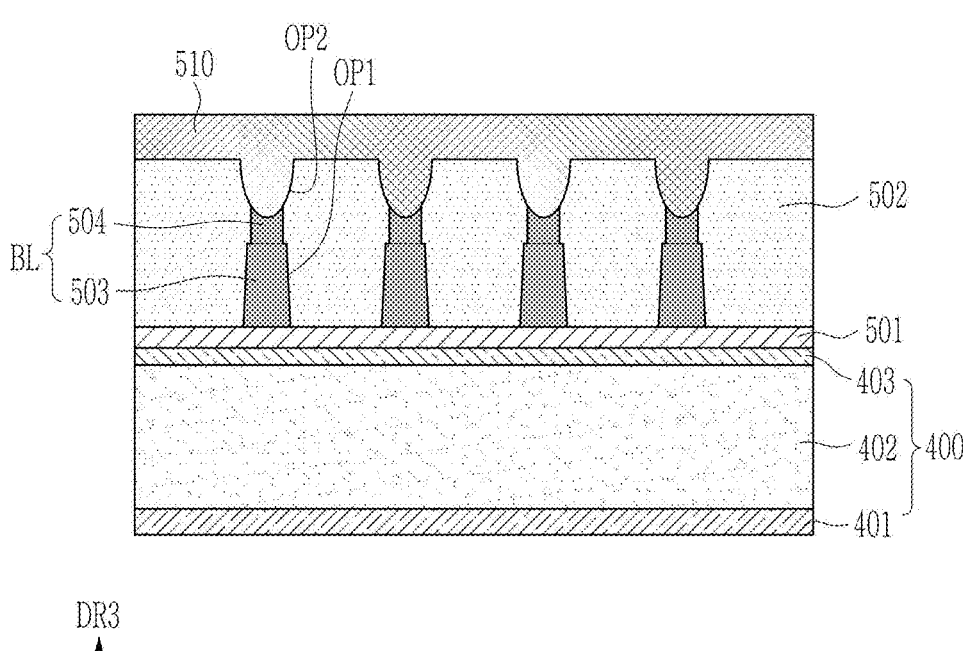
FIG. 4 schematically shows a cross-sectional view of some constituent elements of a display device.

A light blocking pattern formed on a display device according to an embodiment will now be described with reference to FIG. 1 to FIG. 4. FIG. 1 schematically shows a plan view of a pixel of a display device according to an embodiment, FIG. 2 schematically shows a plan view of light blocking patterns and a first layer formed on a display device according to an embodiment, FIG. 3 schematically shows a plan view of a display device of FIG. 1 and FIG. 2, and FIG. 4 schematically shows a cross-sectional view of some constituent elements of a display device.

FIG. 1 shows that three light emitting diodes LED for displaying different colors R, G, and B may be positioned near each other, and the respective light emitting diodes LED may include emission layers EMLr, EMLg, and EMLb.

The respective emission layers EMLr, EMLg, and EMLb may emit light in the light emitting diodes LED, and may be partitioned by a cell barrier 380. The respective emission layers EMLr, EMLg, and EMLb may overlap openings OPr, OPg, and OPb positioned in a cell barrier 380, and at least some of the respective emission layers EMLr, EMLg, and EMLb may not overlap the cell barrier 380 and may be exposed upward. According to an embodiment, the respective emission layers EMLr, EMLg, and EMLb may be positioned in the openings OPr, OPg, and OPb of the cell barrier 380. Although not shown in FIG. 1, a second electrode and an encapsulation layer may be positioned on the cell barrier 380 and the emission layers EMLr, EMLg, and EMLb, and a first electrode may be positioned below the respective emission layers EMLr, EMLg, and EMLb. Here, one first electrode, one of the emission layers EMLr, EMLg, and EMLb, and the second electrode may configure one light emitting diode LED. A detailed stacking structure of the light emitting diode LED will be described in a later part of the specification with reference to FIG. 19.

Figure 2:
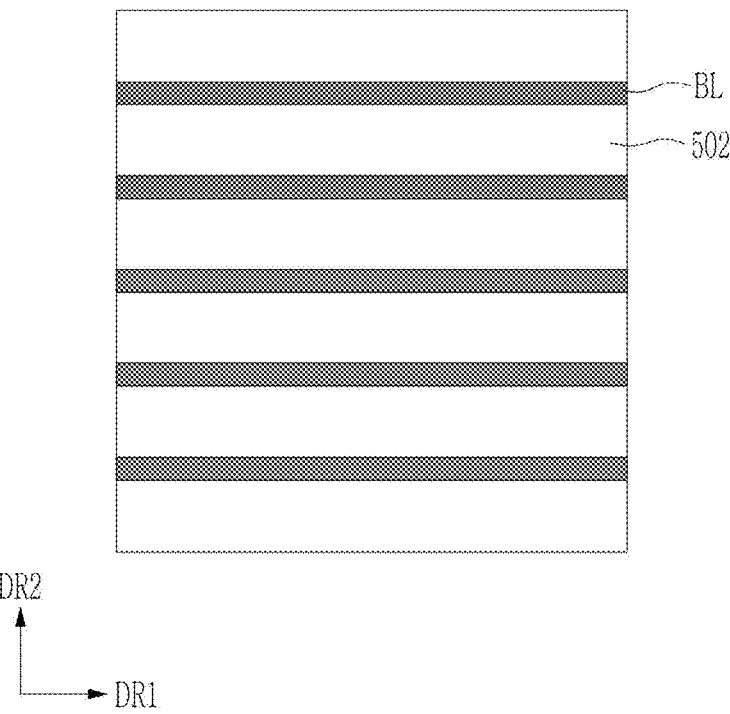
FIG. 2 schematically shows a plan view of light blocking patterns and a first layer formed on a display device according to an embodiment.

FIG. 2 shows multiple light blocking patterns BL disposed on an upper portion of a light emitting diode LED and a first layer 502 positioned near the same in a plan view.

The light blocking patterns BL may extend in one direction, and may be disposed so that the adjacent light blocking patterns BL may have regular intervals. Depending on embodiments, the intervals among the light blocking patterns BL may be irregular.

A first layer 502 may be positioned in a region in which the light blocking patterns BL are not formed. The respective light blocking patterns BL may be positioned in an opening defined in the first layer 502.

Although not shown in FIG. 2, referring to FIG. 4, a second layer 510 may be positioned on the first layer 502 depending on embodiments. The second layer 510 may be formed at the entire surface of the substrate, and a detailed structure thereof will be described in a later portion of the specification.

FIG. 3 shows a structure in which multiple light blocking patterns BL and a first layer 502 shown in FIG. 2 are disposed on an upper portion of a light emitting diode LED arranged as shown in FIG. 1 according to an embodiment.

According to an embodiment described with reference to FIG. 3, a light blocking pattern BL may traverse between a light emitting diode LED, and a light blocking pattern BL may be disposed on respective sides of the light emitting diode LED, and between the adjacent light emitting diode LED.

For example, the openings OPr, OPg, and OPb of the respective emission layers EMLr, EMLg, and EMLb and/or the cell barrier 380 may overlap at least one light blocking pattern BL, and a light blocking pattern BL may pass through centers of the openings OPr, OPg, and OPb of the respective emission layers EMLr, EMLg, and EMLb and/or the cell barrier 380. The openings OPr, OPg, and OPb of the respective emission layers EMLr, EMLg, and EMLb and/or the cell barrier 380 may include a pair of light blocking patterns BL that do not overlap and are positioned near, and the pair of light blocking patterns BL may overlap the cell barrier 380. The above-noted arrangement of the light blocking patterns BL is an embodiment, and the overlapping form between the light blocking pattern BL and the emission layers EMLr, EMLg, and EMLb and/or the cell barrier 380 may be changed according to the intervals of the light blocking patterns BL.

FIG. 4 shows constituent elements positioned on an encapsulation layer 400, and a substrate positioned on a lower portion of the encapsulation layer 400 and a light emitting diode LED including an emission layer are omitted. Emission of light by the light emitting diode LED signifies that, as shown in FIG. 3, the emission layers EMLr, EMLg, and EMLb may emit light, and the light emitted by the emission layers EMLr, EMLg, and EMLb may be discharged in many directions. However, light may not be transmitted by more than a predetermined or given angle because of the light blocking patterns BL positioned on upper portions of the emission layers EMLr, EMLg, and EMLb. As a result, a viewing angle of the display device may be controlled.

The viewing angle of the display device may be set according to distances between the light blocking patterns BL and the emission layers EMLr, EMLg, and EMLb, gaps between the adjacent light blocking patterns BL, and widths and heights of the light blocking patterns BL.

The display device according to an embodiment may include an encapsulation layer 400. The encapsulation layer 400 may include at least one inorganic layer and at least one organic layer, and as shown in the embodiment given with reference to FIG. 4, it may have a triple-layered structure including a first inorganic encapsulation layer 401, an organic encapsulation layer 402, and a second inorganic encapsulation layer 403. The encapsulation layer 400 may protect the emission layer from moisture or oxygen that may be input from outside. Depending on embodiments, the encapsulation layer 400 may include a structure in which the inorganic layer and the organic layer are sequentially stacked on each other. The specification describes an embodiment including the encapsulation layer 400, and without being limited thereto, an encapsulation substrate that is not bent may be included instead.

An inorganic layer 501 may be positioned on the encapsulation layer 400. The inorganic layer 501 may include an inorganic insulating material such as a silicon nitride (SiNx), a silicon oxide (SiOx), and/or a silicon oxynitride (SiOxNy), and may include an organic material depending on embodiments. The inorganic layer 501 may be omitted depending on embodiments.

Figure 19:
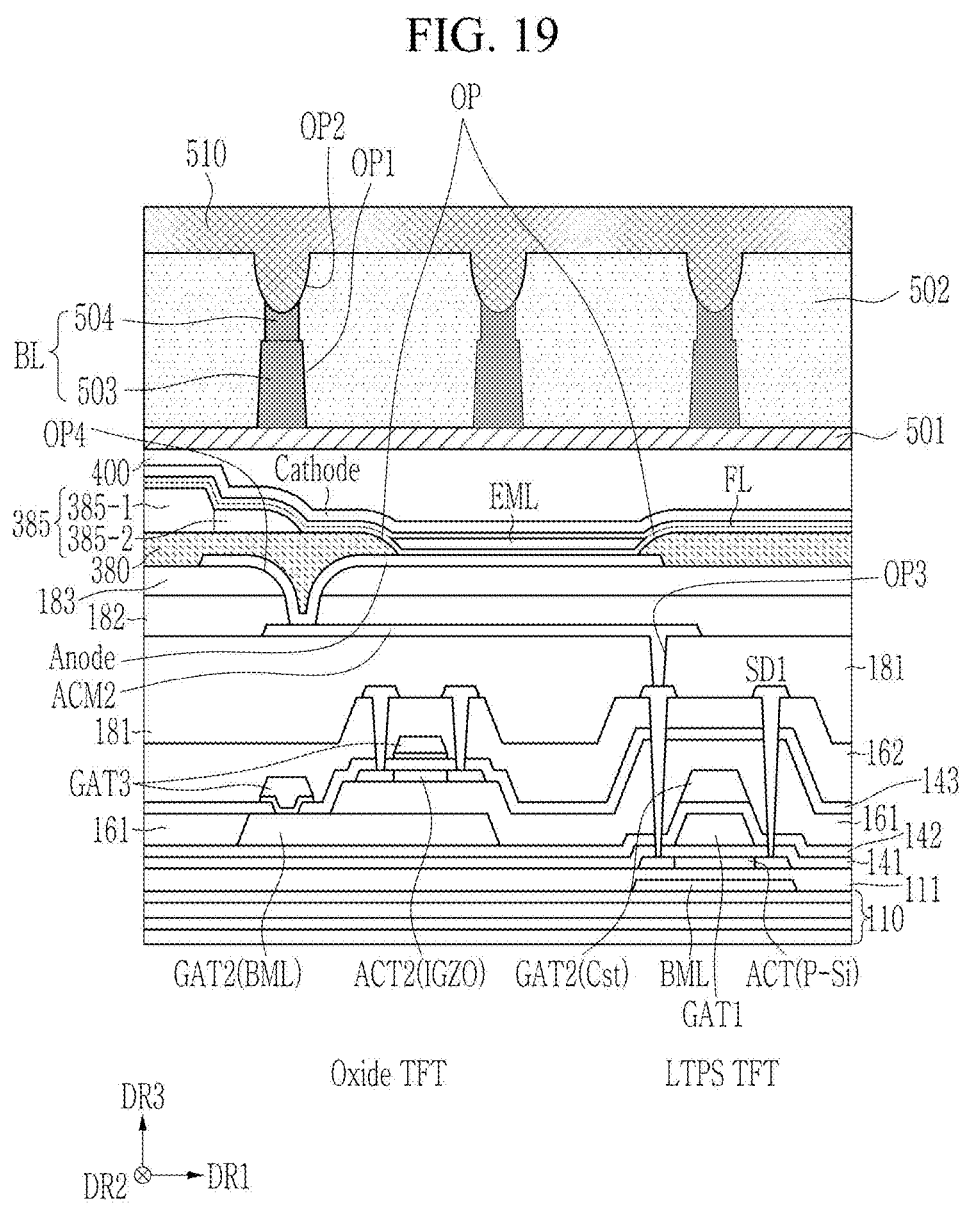

The inorganic layer 501 may overlap an entire surface of the substrate 110 of FIG. 19 to be described. The inorganic layer 501 may prevent the constituent elements that are not covered by the encapsulation layer 400 from being damaged during a process for manufacturing the light blocking patterns BL and the first layer 502.

The first layer 502 may be positioned on the inorganic layer 501.

The first layer 502 may include a first opening OP1 and a second opening OP2 in which a light blocking pattern BL is disposed. The first opening OP1 and the second opening OP2 may be integrally formed (integral with each other). The first opening OP1 may overlap the second opening OP2 in a thickness direction DR3.

The first opening OP1 and a first light blocking pattern 503 may have a same shape. The first opening OP1 may be filled with the first light blocking pattern 503. According to the manufacturing process, the first light blocking pattern 503 may be formed, and the first layer 502 including the first opening OP1 may be formed. The first opening OP1 may have a tapered shape. A width of the first opening OP1 may increase when approaching the inorganic layer 501.

The second opening OP2 may be formed in the first opening OP1. At least part of the second opening OP2 may be filled with a second light blocking pattern 504. A cross-section of the second opening OP2 may have an inversely tapered shape. In another way, the second opening OP2 may have an internal side that is substantially perpendicular to the inorganic layer 501 according to embodiments.

A cross-section area of an upper side of the first opening OP1 may be equal to or greater than a cross-section area of a bottom surface of the second opening OP2 in a cross-sectional view. As shown in FIG. 4, the cross-section of the first opening OP1 may increase when approaching the lower portion with respect to the upper portion, and the cross-section of the second opening OP2 may increase when approaching the upper portion with respect to the lower portion. Depending on embodiments, widths of the lower portion and the upper portion of the cross-section of the second opening OP2 may be equivalent to each other.

The light blocking pattern BL may include a first light blocking pattern 503 and a second light blocking pattern 504. The first light blocking pattern 503 may fill the first opening OP1. The first light blocking pattern 503 may have a linear form extending in the first direction as shown in FIG. 2 and FIG. 3. Further, the first light blocking pattern 503 may have a tapered shape in a cross-sectional view, as shown in FIG. 4. The width of the first light blocking pattern 503 may increase when approaching the inorganic layer 501.

The second light blocking pattern 504 may at least partly fill the second opening OP2. The second light blocking pattern 504 may overlap the first light blocking pattern 503. The second light blocking pattern 504 may have a linear form extending in the first direction in a plan view, as shown in FIG. 2 and FIG. 3. The second light blocking pattern 504 may have an inversely tapered shape or may have a side that is perpendicular to the inorganic layer 501 in a cross-sectional view, as shown in FIG. 4. An upper side of the second light blocking pattern 504 may have a concave shape.

An area of an upper side of the first light blocking pattern 503 may be equal to or greater than an area of a bottom surface of the second light blocking pattern 504.

The light blocking pattern BL may be made of a light blocking material, and may be made of a same material as a black matrix used in the display device. The light blocking pattern BL may be made of an organic material including a black pigment.

The light blocking pattern BL may include a material (or photoresist) for generating a chemical change in case that beams are irradiated. The black pigment may include a light blocking material, and the light blocking material may include a resin or a paste including carbon black, carbon nanotubes, a black dye, metal particles, for example, nickel, aluminum, molybdenum, their alloys, and/or metal oxide particles (e.g., a chromium nitride). The light blocking pattern BL may include a light blocking material and may have a black color, and it may not reflect light but may absorb or block light.

The first light blocking pattern 503 and the second light blocking pattern 504 may be formed according to an additional process, and in case that they include the same material, a boundary of the first light blocking pattern 503 and the second light blocking pattern 504 may be invisible. The first light blocking pattern 503 and the second light blocking pattern 504 may be integrally formed.

The second layer 510 may be positioned on the first layer 502 and the light blocking pattern BL. The second layer 510 may completely cover the upper side of the first layer 502 and the light blocking pattern BL, particularly the upper side of the second light blocking pattern 504. The second layer 510 may fill part of the second opening OP2 included by the first layer 502. Part of the second layer 510 may protrude toward the inorganic layer 501.

A refractive index of the first layer 502 according to an embodiment may be greater than a refractive index of the second layer 510. The first layer 502 may include a material with a relatively high refractive index, and the second layer 510 may include a material with a relatively low refractive index. For example, the first layer 502 may include a material with a refractive index of about 1.6 to about 1.7, and the second layer 510 may include a material with a refractive index of about 1.2 to about 1.5.

In detail, the first layer 502 may include a light-transmitting organic material with a high refractive index. The first layer may be made of an organic insulating material. The refractive index of the first layer 502 may be adjustable by a functional group included in the layer. In another way, the refractive index of the first layer 502 may be adjusted according to a type and a content of the nanoparticles.

The refractive index of the second layer 510 may be less than the refractive index of the first layer 502. At least part of the light generated by the light emitting diode LED may be totally reflected on an interface of the first layer 502 and the second layer 510 so the light may be gathered at the front.

Figure 5:
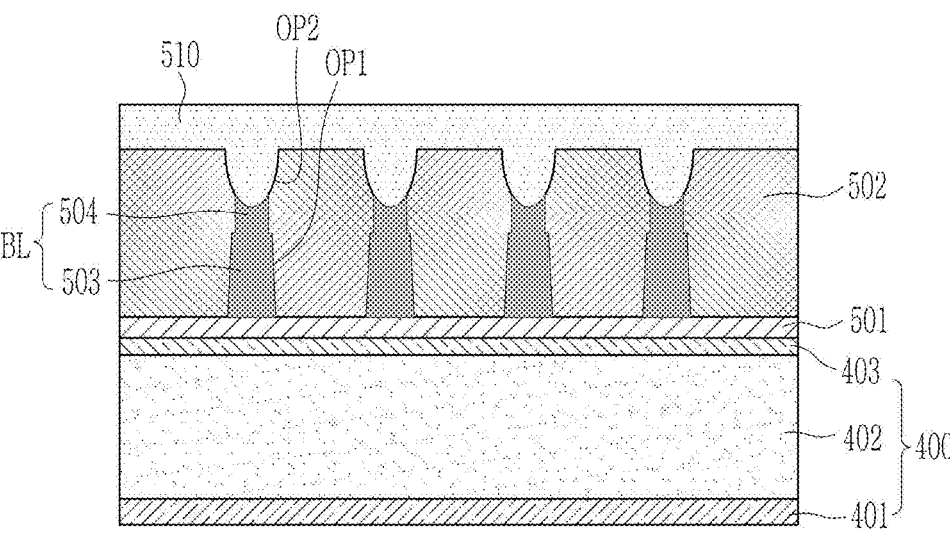
FIG. 5 to FIG. 11 schematically show cross-sectional views of part of a display device according to an embodiment.

However, without being limited thereto, depending on embodiments, the refractive index of the first layer 502 may be less than the refractive index of the second layer 510, as shown in FIG. 5. For example, the first layer 502 may include a material with a relatively low refractive index, and the second layer 510 may include a material with a relatively high refractive index.

According to an embodiment, the first light blocking pattern 503 filling the first opening OP1 and the second light blocking pattern 504 filling the second opening OP2 may be formed according to respective processes. Hence, the forms of the first opening OP1, the second opening OP2, the first light blocking pattern 503, and the second light blocking pattern 504 may be uniformly provided.

A display device according to an embodiment will now be described with reference to FIG. 6 to FIG. 11. FIG. 6 to FIG. 11 schematically show cross-sectional views of part of a display device according to an embodiment. Same or similar constituent elements as the above-described constituent elements will be omitted.

Figure 6:
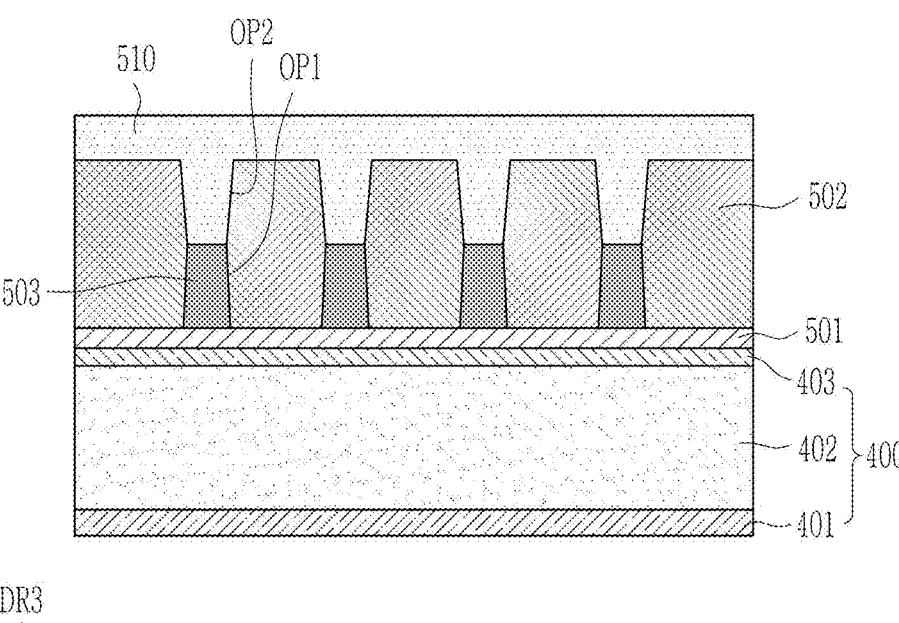

Referring to FIG. 6, an inorganic layer 501 may be positioned on the encapsulation layer 400. The inorganic layer 501 may include an inorganic insulating material such as a silicon nitride (SiNx), a silicon oxide (SiOx), and/or a silicon oxynitride (SiOxNy), and the inorganic layer 501 may be omitted depending on embodiments.

A first layer 502 may be positioned on the inorganic layer 501.

The first layer 502 may include a first opening OP1 and a second opening OP2. The first opening OP1 and the second opening OP2 may be integrally formed. The first opening OP1 may overlap the second opening OP2 in the thickness direction.

The first opening OP1 may have the same shape as the first light blocking pattern 503. The first opening OP1 may be filled with the first light blocking pattern 503. According to the manufacturing process, the first light blocking pattern 503 may be formed, and the first layer 502 including the first opening OP1 may be formed. The first opening OP1 may have a tapered shape. The width of the first opening OP1 may increase when approaching the inorganic layer 501.

The second opening OP2 may be formed in the first opening OP1. The cross-section of the second opening OP2 may have an inversely tapered shape. In another way, the second opening OP2 may have an internal side that is substantially perpendicular to the inorganic layer 501.

The first light blocking pattern 503 may fill the first opening OP1. The first light blocking pattern 503 may have a linear form extending in the first direction DR1, as shown in FIG. 2 and FIG. 3. The first light blocking pattern 503 may also have a tapered shape in a cross-sectional view, as shown in FIG. 6. The width of the first light blocking pattern 503 may increase when approaching the inorganic layer 501.

A second layer 510 may be positioned on the first layer 502 and the first light blocking pattern 503. The second layer 510 may completely cover the upper side of the first layer 502 and the upper side of the first light blocking pattern 503. The second layer 510 may contact the first light blocking pattern 503. The second layer 510 may completely fill the second opening OP2 included by the first layer 502. Part of the second layer 510 may protrude toward the inorganic layer 501.

The refractive index of the first layer 502 may be greater than the refractive index of the second layer 510. For example, the first layer 502 may include a material with a relatively high refractive index, and the second layer 510 may include a material with a relatively low refractive index.

Figure 7:
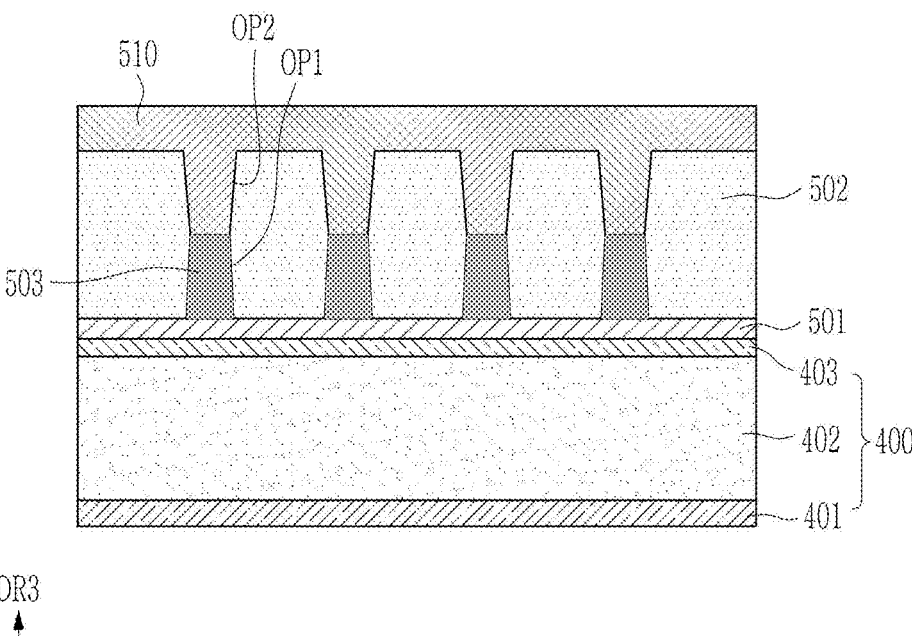

However, without being limited thereto, depending on embodiments, as shown in FIG. 7, the refractive index of the first layer 502 may be less than the refractive index of the second layer 510. For example, the first layer 502 may include a material with a relatively low refractive index, and the second layer 510 may include a material with a relatively high refractive index.

Figure 8:
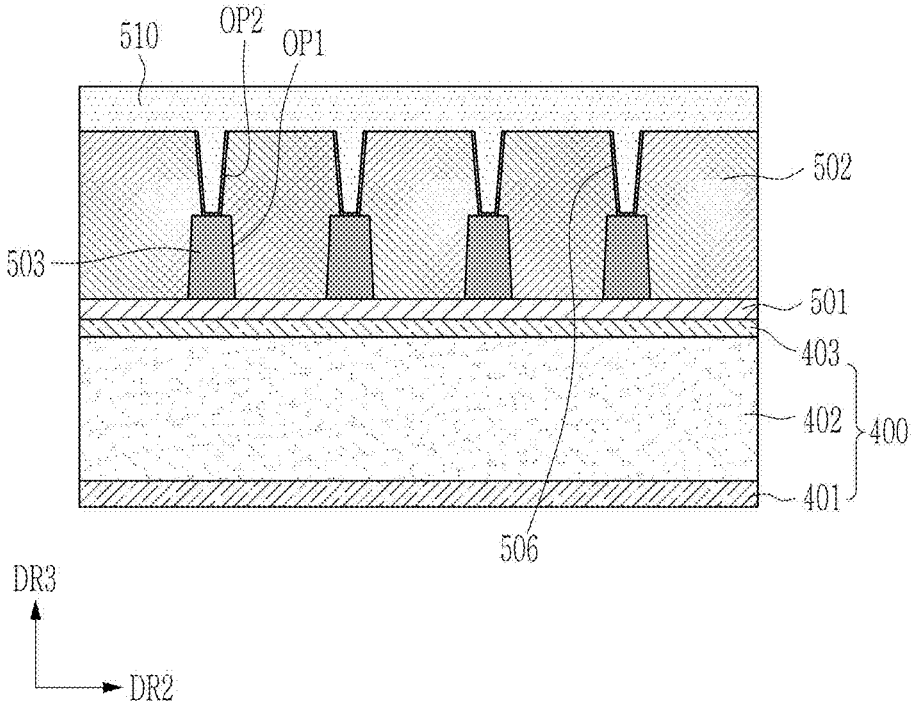

An inorganic layer 501 may be positioned on the encapsulation layer 400 according to an embodiment with reference to FIG. 8. The inorganic layer 501 may include an inorganic insulating material such as a silicon nitride (SiNx), a silicon oxide (SiOx), and/or a silicon oxynitride (SiOxNy), and the inorganic layer 501 may be omitted depending on embodiments.

The first layer 502 may be positioned on the inorganic layer 501.

The first layer 502 may include a first opening OP1 and a second opening OP2. The first opening OP1 and the second opening OP2 may be integrally formed. The first opening OP1 may overlap the second opening OP2 in the thickness direction.

The first opening OP1 and the first light blocking pattern 503 may have the same shape. The first opening OP1 may be filled with the first light blocking pattern 503. According to the manufacturing process, the first light blocking pattern 503 may be formed, and the first layer 502 including the first opening OP1 may be formed. The first opening OP1 may have a tapered shape. The width of the first opening OP1 may increase when approaching the inorganic layer 501.

The second opening OP2 may be formed in the first opening OP1. The cross-section of the second opening OP2 may have an inversely tapered shape. In another way, the second opening OP2 may have an internal side that is substantially perpendicular to the inorganic layer 501.

The first light blocking pattern 503 may fill the first opening OP1. The first light blocking pattern 503 may have a linear form extending in the first direction DR1 in a plan view, as shown in FIG. 2 and FIG. 3. The first light blocking pattern 503 may have a tapered shape in a cross-sectional view, as shown in FIG. 8. The width of the first light blocking pattern 503 may increase when approaching the inorganic layer 501.

According to an embodiment described with reference to FIG. 8, the display device may further include a metal layer 506 positioned in the second opening OP2. The metal layer 506 may cover the second opening OP2. The metal layer 506 may overlap the upper side of the first black matrix 503. The metal layer 506 may contact the upper side of the first black matrix 503 exposed by the second opening OP2.

The metal layer 506 may be made of a single layer or a multilayer. The metal layer 506 may include molybdenum, and for example, the metal layer may be a multilayer including a layer including molybdenum and a layer including a molybdenum titanium oxide (MTO).

The second layer 510 may be positioned on the first layer 502 and the metal layer 506. The second layer 510 may completely cover the upper side of the first layer 502 and the metal layer 506. Part of the second layer 510 may fill the second opening OP2 included by the first layer 502. Part of the second layer 510 may protrude toward the inorganic layer 501.

The refractive index of the first layer 502 may be greater than the refractive index of the second layer 510. The first layer 502 may include a material with a relatively high refractive index, and the second layer 510 may include a material with a relatively low refractive index.

Figure 9:
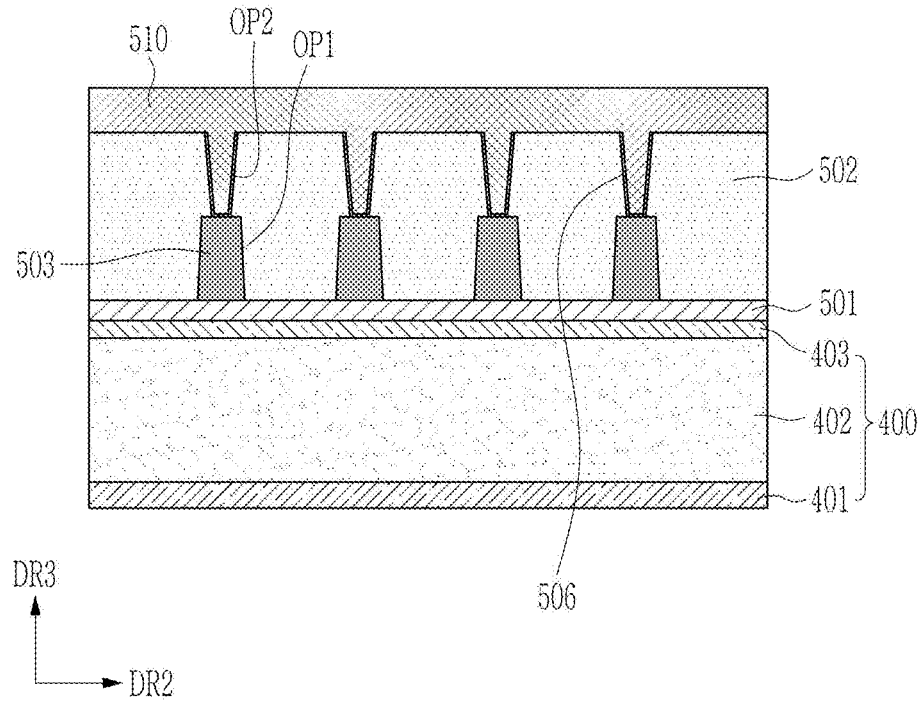

However, without being limited thereto, depending on embodiments, as shown in FIG. 9, the refractive index of the first layer 502 may be less than the refractive index of the second layer 510. For example, the first layer 502 may include a material with a relatively low refractive index, and the second layer 510 may include a material with a relatively high refractive index.

Figure 10:
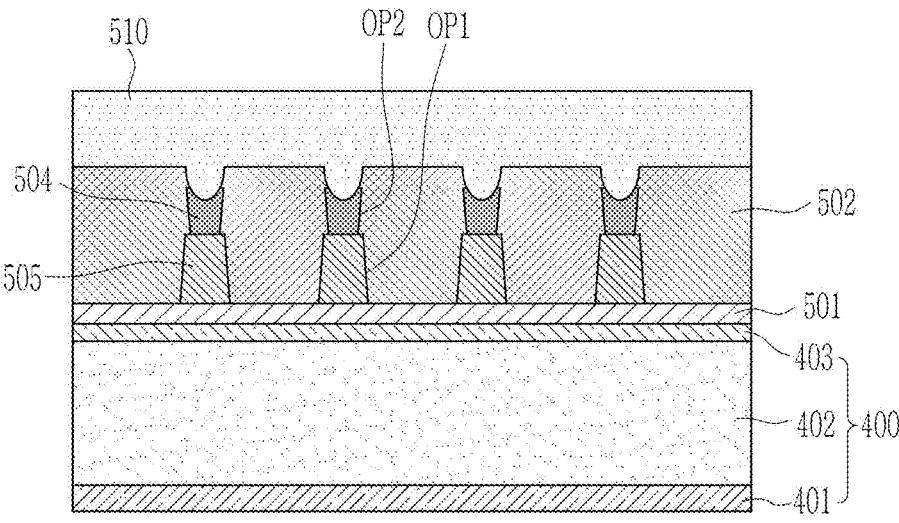

Referring to FIG. 10, an inorganic layer 501 may be positioned on the encapsulation layer 400 according to an embodiment. The inorganic layer 501 may include an inorganic insulating material such as a silicon nitride (SiNx), a silicon oxide (SiOx), and/or a silicon oxynitride (SiOxNy), and the inorganic layer 501 may be omitted depending on embodiments.

The first layer 502 may be positioned on the inorganic layer 501.

The first layer 502 may include a first opening OP1 and a second opening OP2. The first opening OP1 and the second opening OP2 may be integrally formed. The first opening OP1 may overlap the second opening OP2 in the thickness direction.

The first opening OP1 may have the same shape as the linear pattern 505. The first opening OP1 may be filled with the linear pattern 505. According to the manufacturing process, the linear pattern 505 may be formed, and the first layer 502 including the first opening OP1 may be formed. The first opening OP1 may have a tapered shape. The width of the first opening OP1 may increase when approaching the inorganic layer 501.

The second opening OP2 may be formed in the first opening OP1. The cross-section of the second opening OP2 may have an inversely tapered shape. In another way, the second opening OP2 may have an internal side that is linearly perpendicular to the inorganic layer 501.

The linear pattern 505 may fill the first opening OP1. The linear pattern 505 may have a linear form extending in the first direction DR1 in a plan view in a like way of the light blocking pattern shown in FIG. 2 and FIG. 3. The linear pattern 505 may have a tapered shape in a cross-sectional view, as shown in FIG. 10. The width of the linear pattern 505 may increase when approaching the inorganic layer 501.

The light blocking pattern 504 may be positioned in the second opening OP2. The light blocking pattern 504 may have the same shape as the cross-section of the second opening OP2, and for example, the width may increase toward the upper surface. The light blocking pattern 504 may fill at least part of the second opening OP2. The light blocking pattern 504 may not fill at least part of the second opening OP2. The upper side of the light blocking pattern 504 may have a concave shape.

The light blocking pattern 504 may have a linear form extending in the first direction DR1 in a plan view in a like way of the light blocking pattern shown in FIG. 2 and FIG. 3. The light blocking pattern 504 may have an inversely tapered shape in a cross-sectional view, as shown in FIG. 10. The width of the light blocking pattern 504 may increase when approaching the second layer 510.

The light blocking pattern 504 may include a material (or photoresist) for generating a chemical change in case that beams are irradiated. The black pigment may include a light blocking material, and the light blocking material may include a resin or a paste including carbon black, carbon nanotubes, a black dye, metal particles, for example, nickel, aluminum, molybdenum, their alloys, and/or metal oxide particles (e.g., a chromium nitride). The light blocking pattern 504 may include a light blocking material and may have a black color, and it may not reflect light but may absorb or block it.

The second layer 510 may be positioned on the first layer 502 and the light blocking pattern 504. The second layer 510 may completely cover the upper side of the first layer 502 and the light blocking pattern 504. The second layer 510 may fill the second opening OP2 included by the first layer 502. Part of the second layer 510 may protrude toward the inorganic layer 501. The second layer 510 may contact the light blocking pattern 504 in the second opening OP2.

Figure 11:
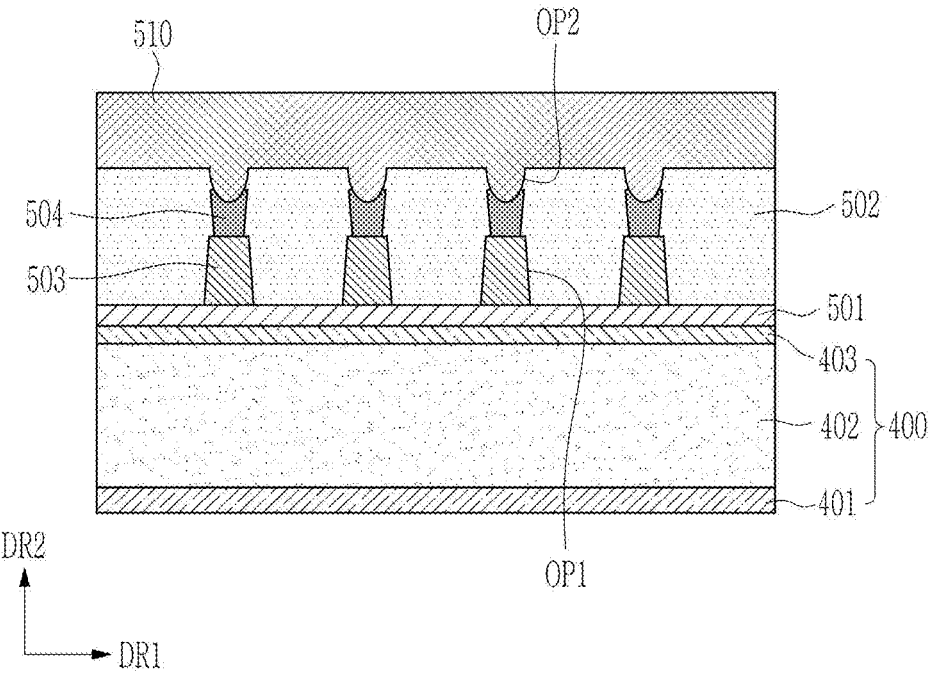

The refractive index of the first layer 502 may be greater than the refractive index of the second layer 510. For example, the first layer 502 may include a material with a relatively high refractive index, and the second layer 510 may include a material with a relatively low refractive index. However, without being limited thereto, depending on embodiments, as shown in FIG. 11, the refractive index of the first layer 502 may be less than the refractive index of the second layer 510. For example, the first layer 502 may include a material with a relatively low refractive index, and the second layer 510 may include a material with a relatively high refractive index.

Figure 12:
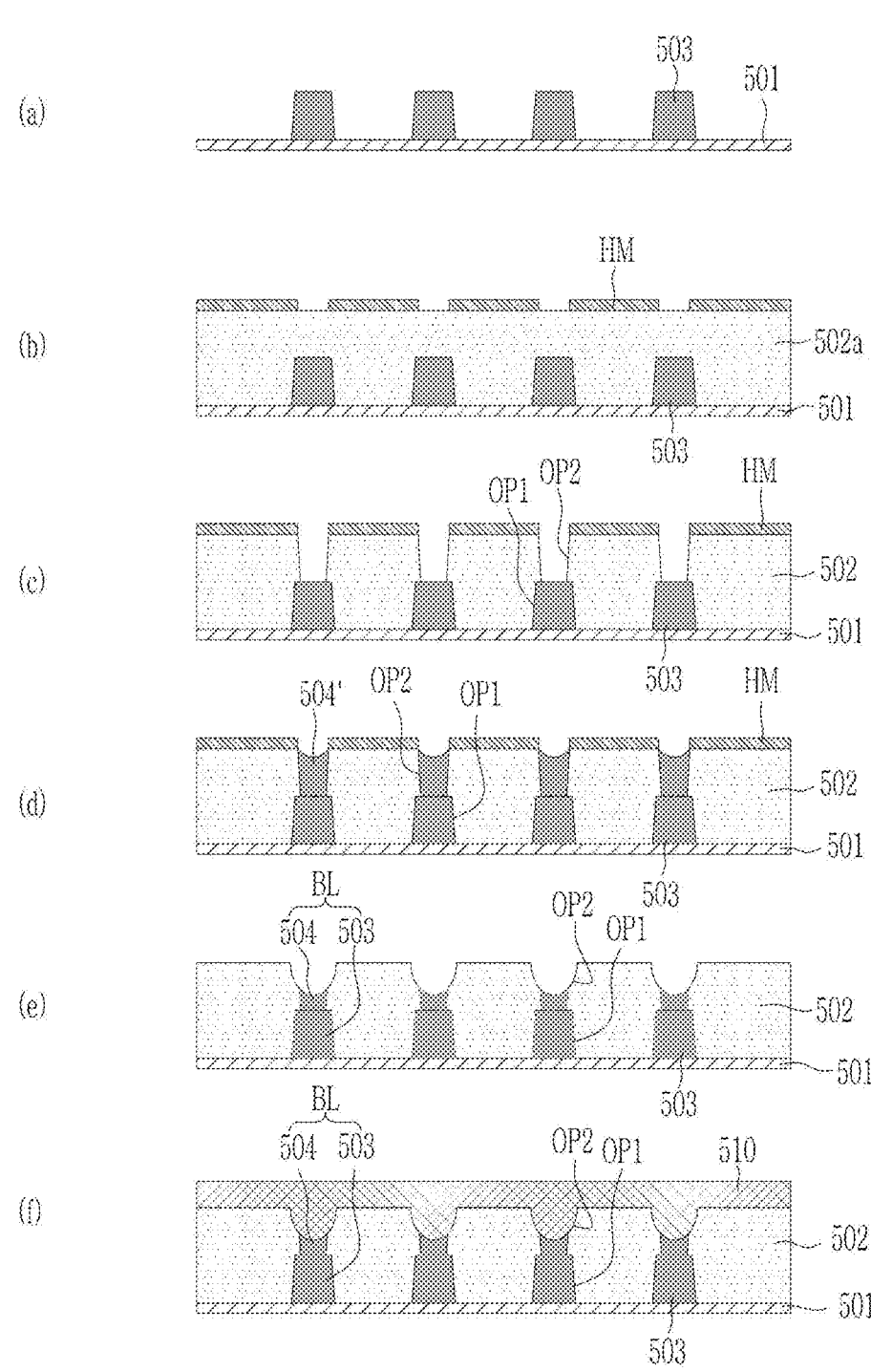
FIG. 12 schematically shows a cross-sectional view for manufacturing a display device according to an embodiment of FIG. 4 and FIG. 5.
Figure 13:
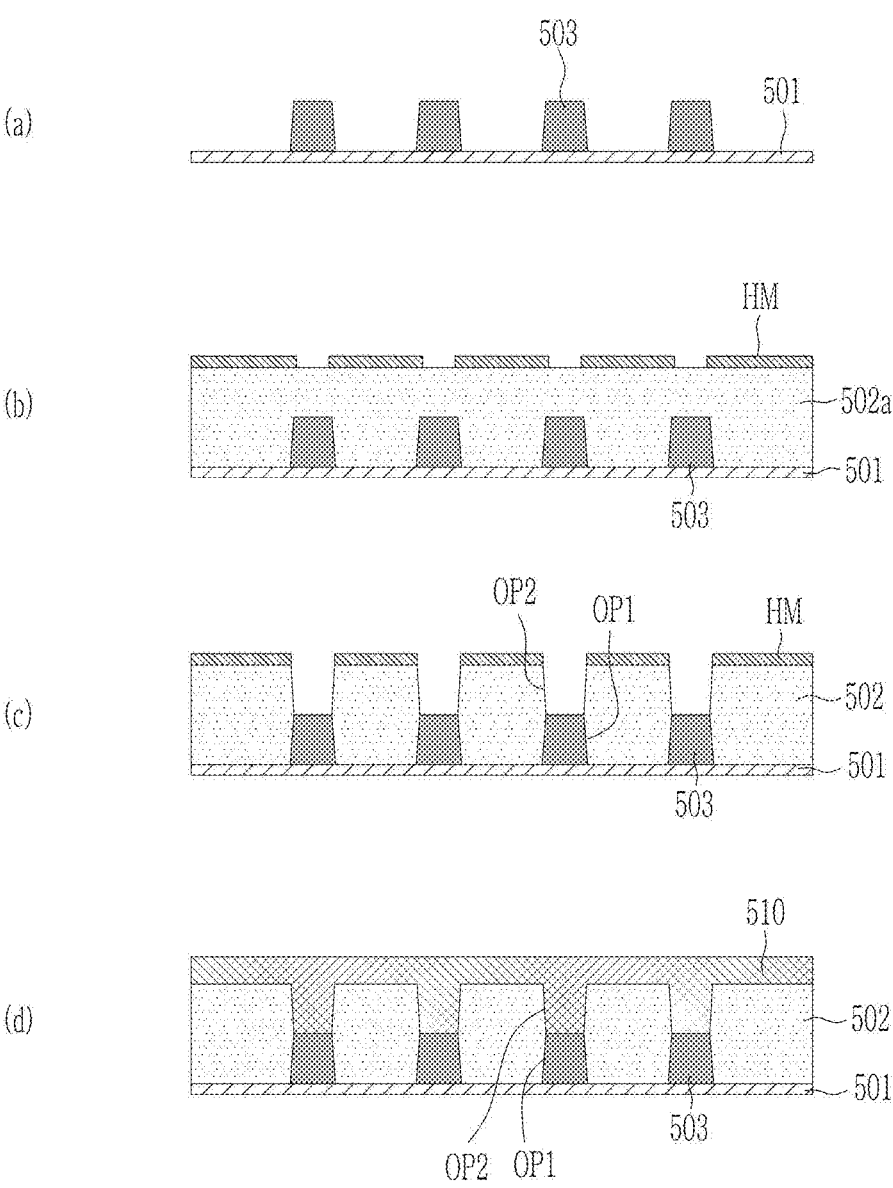
FIG. 13 schematically shows a cross-sectional view for manufacturing a display device according to an embodiment of FIG. 6 and FIG. 7.
Figure 14:
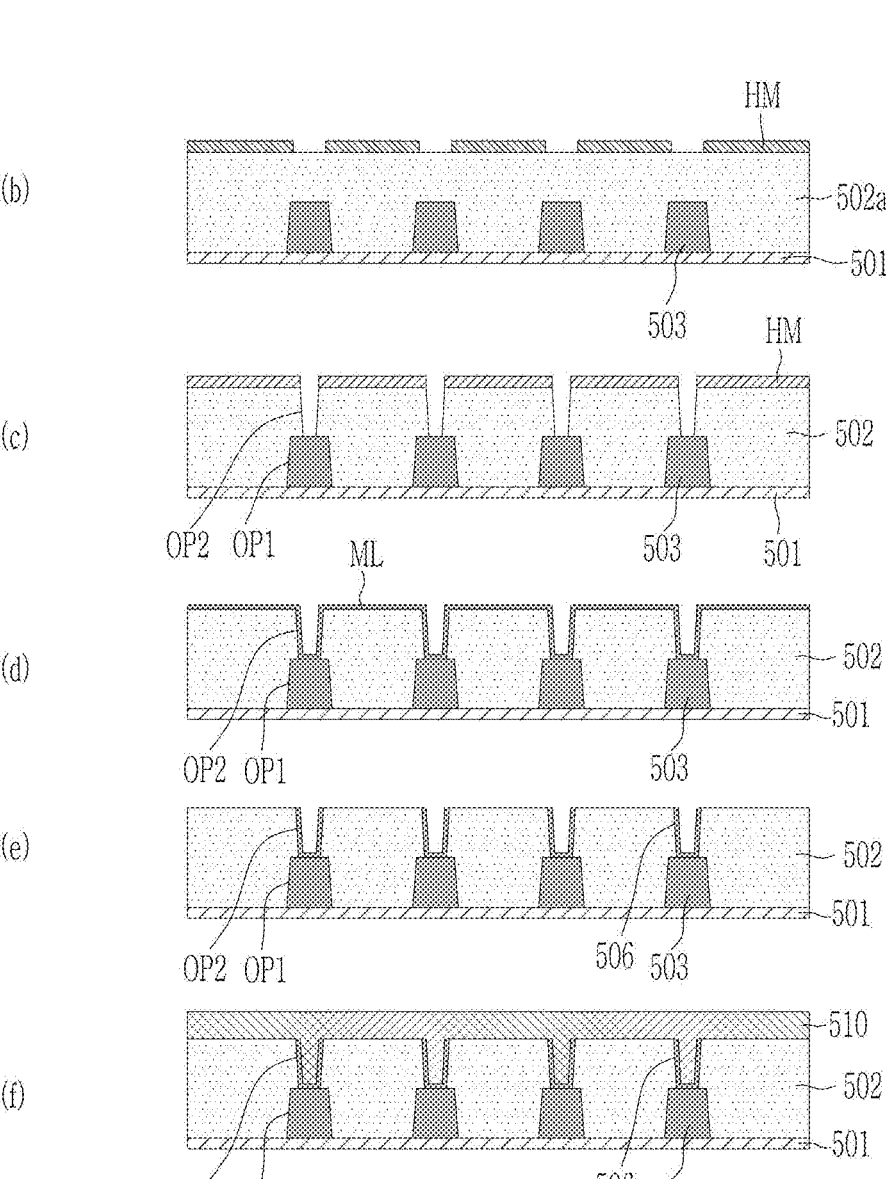
FIG. 14 schematically shows a cross-sectional view for manufacturing a display device according to an embodiment of FIG. 8 and FIG. 9.
Figure 15:
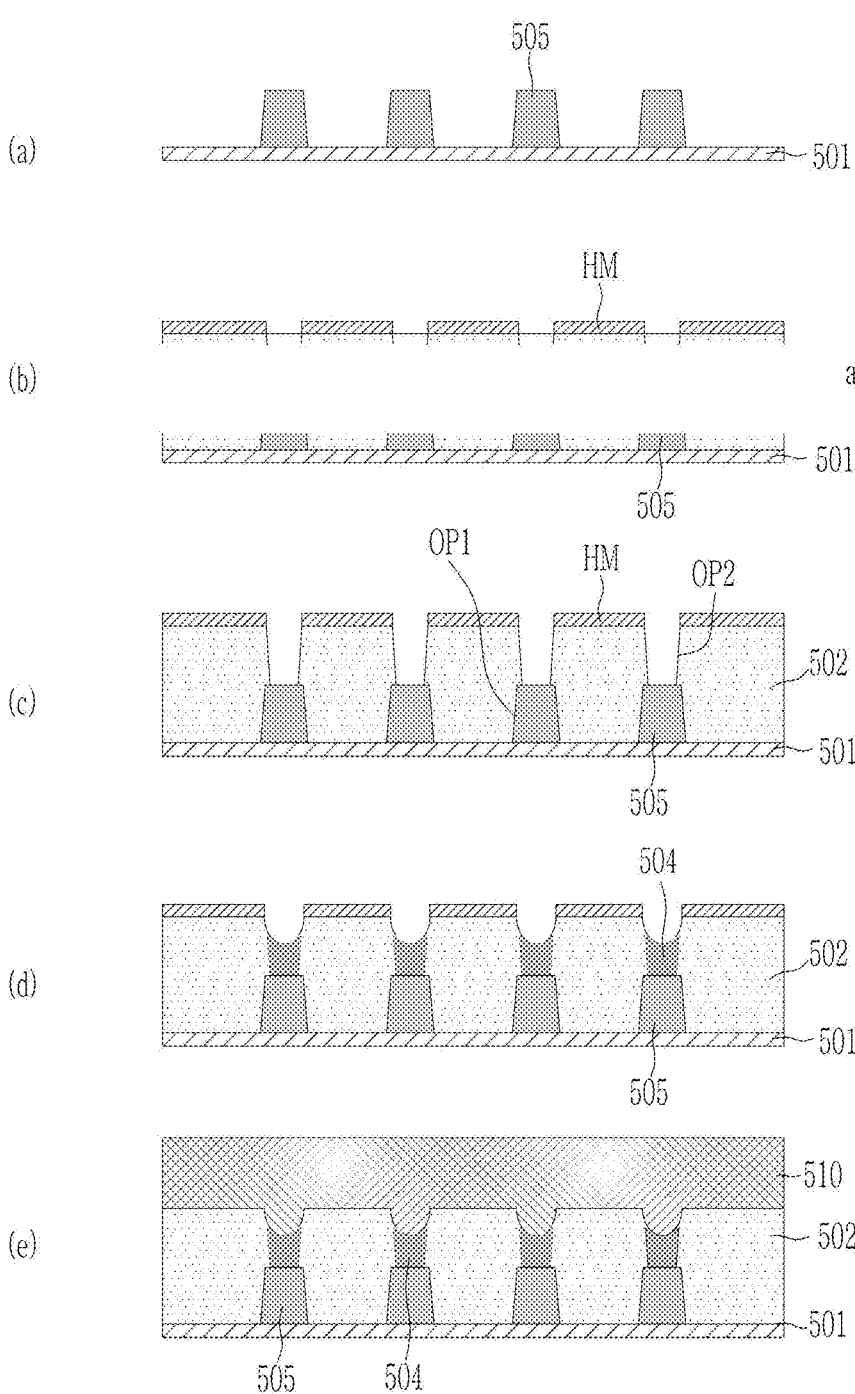
FIG. 15 schematically shows a cross-sectional view for manufacturing a display device according to an embodiment of FIG. 10 and FIG. 11.

A method for manufacturing a display device according to an embodiment will now be described with reference to FIG. 12 to FIG. 15. FIG. 12 schematically shows a cross-sectional view for manufacturing a display device according to an embodiment of FIG. 4 and FIG. 5, FIG. 13 schematically shows a cross-sectional view for manufacturing a display device according to an embodiment of FIG. 6 and FIG. 7, FIG. 14 schematically shows a cross-sectional view for manufacturing a display device according to an embodiment of FIG. 8 and FIG. 9, and FIG. 15 schematically shows a cross-sectional view for manufacturing a display device according to an embodiment of FIG. 10 and FIG. 11.

Referring to FIG. 12 (*a*), an inorganic layer 501 may be formed on the above-described encapsulation layer. The inorganic layer 501 may overlap an entire surface of a substrate 110 of FIG. 19 to be described. The inorganic layer 501 may be omitted depending on embodiments. A first light blocking pattern 503 may be formed on the inorganic layer 501. The first light blocking pattern 503 may have a tapered shape.

As shown in FIG. 12 (*b*), a first material layer 502a may be applied on the inorganic layer 501 and the first light blocking pattern 503. The first material layer 502a may be made by an inkjet process. A hard mask HM including an opening overlapping the first light blocking pattern 503 may be formed on the first material layer 502a.

The first material layer 502a may be dry-etched with the hard mask HM as a mask. As shown in FIG. 12 (*c*), the first layer 502 including the second opening OP2 may be formed. Further, although not formed through an additional etching process, the first layer 502 may include a first opening OP1 overlapping the first light blocking pattern 503 by the first light blocking pattern 503.

A light blocking material may be applied on the hard mask HM and the first light blocking pattern 503, and an etching and ashing process may be performed. As shown in FIG. 12 (*d*), a second initial light blocking pattern 504' positioned in the second opening OP2 may be formed.

As shown in FIG. 12 (*e*), a concave second light blocking pattern 504 may be formed by removing the hard mask HM and removing part of the second initial light blocking pattern 504'.

As shown in FIG. 12 (0, the first layer 502 and the second layer 510 covering the second light blocking pattern 504 may be formed by providing the material forming the second layer 510 according to the inkjet process.

Accordingly, the light blocking pattern BL and the constituent elements positioned near the light blocking pattern BL shown in FIG. 4 and FIG. 5 may be manufactured. According to an embodiment, the first light blocking pattern 503 and the second light blocking pattern 504 may be formed by different processes. The first light blocking pattern 503 may be formed according to an additional patterning process, and the second light blocking pattern 504 may be formed by etching part of the first layer 502 and providing a light blocking material into the opening. The process for etching the first layer 502 in the thickness direction may be to form the second opening OP2, and the time used here may be short. Therefore, the uniform second opening OP2 may be readily provided. The second light blocking pattern 504 filling the second opening OP2 may also be provided in a uniform shape.

A method for manufacturing a structure according to an embodiment shown in FIG. 6 and FIG. 7 will now be described with reference to FIG. 13.

As shown in FIG. 13 (*a*), a first light blocking pattern 503 may be formed on the inorganic layer 501. The first light blocking pattern 503 may have a tapered shape.

As shown in FIG. 13 (*b*), a first material layer 502*a* may be applied to the inorganic layer 501 and the first light blocking pattern 503. The first material layer 502*a* may be made according to the inkjet process. A hard mask HM including an opening overlapping the first light blocking pattern 503 may be formed on the first material layer 502*a*.

The first material layer 502*a* may be dry-etched with the hard mask HM as a mask. Depending on embodiments, the etching process may be the dry etching process. As shown in FIG. 13 (*c*), the first layer 502 including the second opening OP2 may be formed. Further, although not formed through an additional etching process, the first layer 502 may include the first opening OP1 overlapping the first light blocking pattern 503 by the first light blocking pattern 503.

A material for forming the second layer 510 on the first layer 502 and the first light blocking pattern 503 may be provided according to the inkjet process. As shown in FIG. 13 (*d*), the second layer 510 for covering the first layer 502 and the first light blocking pattern 503 may be formed.

According to the above-described manufacturing process, the light blocking pattern 503 and the constituent elements positioned near the light blocking pattern 503 shown in FIG. 6 and FIG. 7 may be provided.

A method for manufacturing a configuration according to an embodiment of FIG. 8 and FIG. 9 will now be described with reference to FIG. 14.

Referring to FIG. 14 (*a*), an inorganic layer 501 may be formed on the above-described encapsulation layer. The inorganic layer 501 may be omitted depending on embodiments. A first light blocking pattern 503 may be formed on the inorganic layer 501. The first light blocking pattern 503 may have a tapered shape.

As shown in FIG. 14 (*b*), a first material layer 502*a* may be formed on the inorganic layer 501 and the first light blocking pattern 503. The first material layer 502*a* may be formed according to the inkjet process. A hard mask HM including an opening overlapping the first light blocking pattern 503 may be formed on the first material layer 502*a*.

The first material layer 502*a* may be dry-etched with the hard mask HM as a mask. As shown in FIG. 14 (*c*), the first layer 502 including the second opening OP2 may be formed. Further, although not formed through an additional etching process, the first layer 502 may include the first opening OP1 overlapping the first light blocking pattern 503 by the first light blocking pattern 503.

As shown in FIG. 14 (*d*), a metal material layer ML overlapping an entire surface of the inorganic layer 501 may be formed. The metal material layer ML may be a single layer or a multilayer. For example, the metal material layer ML may be a multilayer including a layer including molybdenum and a layer including a molybdenum titanium oxide (MTO).

By removing the metal material layer ML positioned on the upper side of the first layer 502 according to the etching process, the metal layer 506 positioned in the second opening OP2 may be formed, as shown in FIG. 14 (*e*). A material for forming the second layer 510 on the first layer 502 is provided according to the inkjet process. As shown in FIG. 14 (*f*), a second layer 510 for covering the first layer 502 and the metal layer 506 may be formed.

According to the above-described manufacturing method, the light blocking pattern 503 and the constituent elements positioned near the light blocking pattern 503 shown in FIG. 8 and FIG. 9 may be provided.

A method for manufacturing a configuration according to an embodiment of FIG. 10 and FIG. 11 will now be described with reference to FIG. 15.

As shown in FIG. 15 (*a*), a linear pattern 505 may be formed on the inorganic layer 501. The linear pattern 505 may have a tapered shape.

As shown in FIG. 15 (*b*), the first material layer 502*a* may be applied to the inorganic layer 501 and the linear pattern 505. The first material layer 502*a* may be formed according to the inkjet process. A hard mask HM overlapping the first light blocking pattern 503 may be formed on the first material layer 502*a*.

The first layer 502 including the second opening OP2 may be formed by dry-etching the first material layer 502*a* with the hard mask HM as a mask, as shown in FIG. 15 (*c*). Further, although not formed through an additional etching process, the first layer 502 may include the first opening OP1 overlapping the linear pattern 505 by the linear pattern 505.

As shown in FIG. 15 (*d*), the light blocking pattern 504 positioned in the second opening OP2 may be formed according to the patterning process after applying the light blocking material. The hard mask HM may be removed, and the material for forming the second layer 510 on the first layer 502 may be provided according to the inkjet process. As shown in FIG. 15 (*e*), the second layer 510 for covering the first layer 502 and the light blocking pattern 504 may be formed.

Accordingly, the light blocking pattern 504 and the constituent elements positioned near the light blocking pattern 504 shown in FIG. 10 and FIG. 11 may be manufactured.

Figure 16:
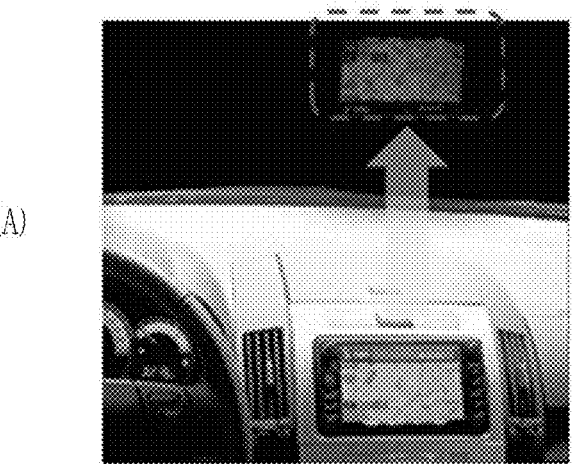
FIG. 16 schematically shows a case where a display device according to a comparative example is applied to a vehicle.
Figure 16:
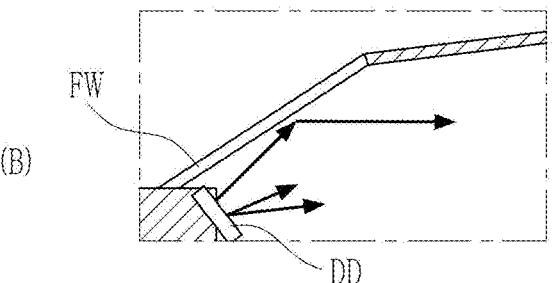
Figure 17:
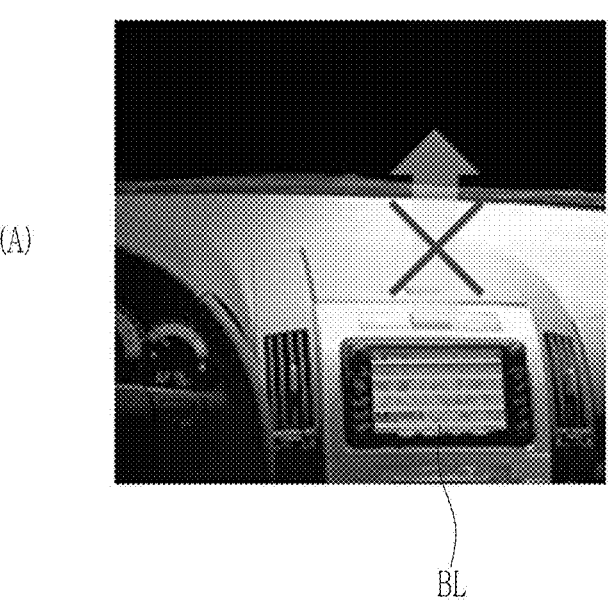
FIG. 17 schematically shows a case where a display device according to an embodiment is applied to a vehicle.
Figure 17:
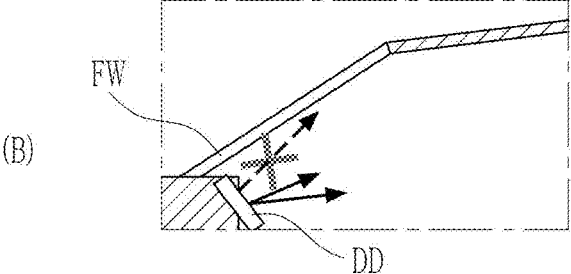
Figure 18:
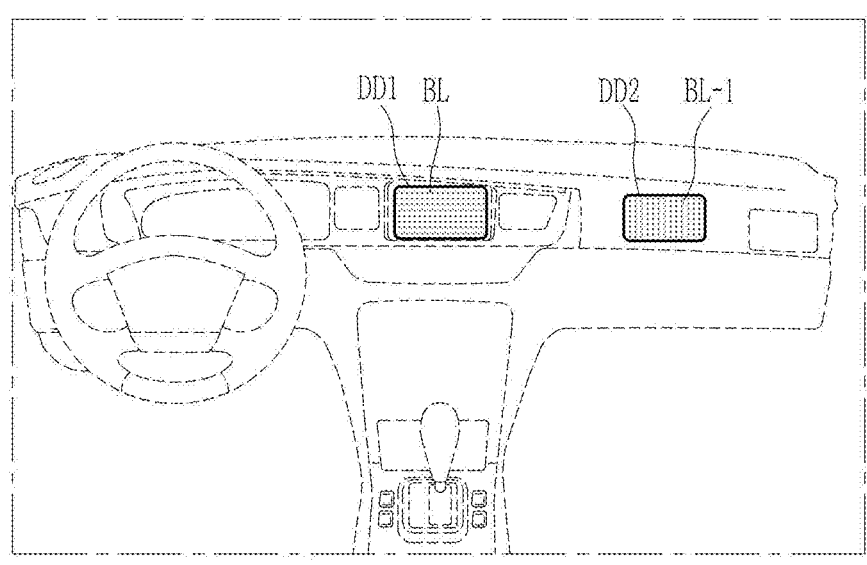
FIG. 18 schematically shows a case where a display device according to another embodiment is applied to a vehicle.

A display device according to an embodiment and a comparative example will now be described with reference to FIG. 16 to FIG. 19. FIG. 16 schematically shows a case where a display device according to a comparative example is applied to a vehicle, FIG. 17 schematically shows a case where a display device according to an embodiment is applied to a vehicle, FIG. 18 schematically shows a case where a display device according to another embodiment is applied to a vehicle, and FIG. 19 schematically shows a cross-sectional structure of a display device according to an embodiment.

An embodiment of forming the light blocking pattern BL in the display device may be different from a comparative example of reducing the viewing angle by attaching a film to an entire surface of the display device at least in the following aspects.

First, a misalignment may be generated in case that the film is attached according to a comparative example, and the moiré phenomenon may be generated in case that the film is erroneously attached. In contrast, in an embodiment of the disclosure, no misalignment may be generated, and the moiré phenomenon may be easily removed by adjusting the interval of the light blocking patterns BL.

Further, the comparative example of attaching a film increases a manufacturing cost, and transmittance is reduced because of a light loss generated at the interface by an adhesive at the time of attachment, which is a drawback.

To form the light blocking pattern, the opening in a uniform shape must be made in the thickness direction, and in case that the opening is formed according to a single process, the width of the opening may not be not constant.

Effects given when a display device including the light blocking pattern BL having the above-described configuration and formed according to the above-described manufacturing method is applied to the vehicle will now be compared to the comparative example given with FIG. 16 and will now be described with reference to FIG. 17.

Regarding the comparative example described with reference to FIG. 16, the display device DD used in the vehicle includes no light blocking pattern BL, so as shown in FIG. 16 (B), angles of the emitted light are not limited but the light is emitted in many directions.

In contrast, in an embodiment given with reference to FIG. 17, the display device DD used in the vehicle may include multiple light blocking patterns BL arranged in a direction (or a horizontal direction) and blocks part of the light emitted upward and downward. Light equal to or greater than 30 degrees may be blocked with respect to a normal line that is perpendicular to the entire surface of the display device DD.

Referring to FIG. 16 (A), the light emitted by the display device DD positioned on the center fascia of the vehicle is also provided to the front side of glass (FW) of the vehicle, and the light emitted by the display device DD may be reflected at the front side of glass (FW) and may be applied to eyes of the driver so it may hinder driver sight.

Referring to FIG. 17, the display device DD used in the vehicle may include multiple light blocking patterns BL so that the light emitted by the display device DD may not be transmitted to the front side of the glass (FW), so the light may not be reflected at the front side of the glass (FW) of the vehicle and driver sight may not be hindered.

Depending on embodiments, an arrangement direction of the display device DD used in the vehicle and multiple light blocking patterns BL may be variable, and an embodiment thereof will now be described with reference to FIG. 18.

FIG. 18 shows a case where a display device according to another embodiment is applied to a vehicle. Two display devices DD1 and DD2 may be attached to a vehicle according to an embodiment given with reference to FIG. 18.

The first display device DD1 may be, as shown in FIG. 18, positioned on the center fascia, and may include multiple light blocking patterns BL arranged in the horizontal direction. As a result, light may be prevented from being reflected on the front side of the glass, and driver sight is not hindered.

The second display device DD2 may be positioned prior to the passenger seat, and may include multiple light blocking patterns BL-1 arranged in the perpendicular direction. Because of the light blocking patterns BL-1 arranged in the perpendicular direction, light emitted by the second display device DD2 may not be provided to the right and the left so a user sitting on the passenger seat may watch a screen of the second display device DD2, and the driver may not watch the screen of the second display device DD2. As a result, the driver may focus on the driving while paying no attention to the second display device DD2, which is a merit.

The configuration of the light blocking pattern BL and the peripheral portions together with the schematic structure of the display device, and the manufacturing method thereof, have been described in detail.

FIG. 19 shows a stacking structure of a pixel positioned in a display area of a display device.

The display device may include a light emitting diode LED, a pixel circuit, and an encapsulation layer 400 for covering them. Here, the pixel circuit may include a second organic layer 182 and a third organic layer 183 and may signify a configuration of a lower portion thereof, and the light emitting diode LED may be an upper portion of the third organic layer 183 and may signify a configuration positioned on a lower portion of the encapsulation layer 400. The third organic layer 183 may not be included, depending on embodiments.

Referring to FIG. 19, a metal layer BML may be positioned on the substrate 110.

The substrate 110 may include a material that has a rigid characteristic and is not bent such as glass, or may include a flexible material that is bent such as plastic or polyimide. As shown in FIG. 19, the flexible substrate may have a structure in which a double-layered structure including a polyimide and a barrier layer made of an inorganic insulating material disposed thereon is provided twice.

The metal layer BML may be formed on a position at which the same overlaps a channel of a driving transistor from among a first semiconductor layer ACT(P-Si) in a plan view, and is also referred to as a lower shielding layer. The metal layer BML may include a metal such as copper (Cu), molybdenum (Mo), aluminum (Al), titanium (Ti), and/or their metal alloys. Here, the driving transistor may signify a transistor for generating a current transmitted to the light emitting diode LED.

A buffer layer 111 for covering the substrate 110 and the metal layer BML may be positioned on the substrate 110 and the metal layer BML. The buffer layer 111 may block permeation of impure elements into a first semiconductor layer ACT(P-Si), and it may be an inorganic insulating layer including the silicon oxide (SiOx), the silicon nitride (SiNx), and/or the silicon oxynitride (SiOxNy).

The first semiconductor layer ACT(P-Si) made of a silicon semiconductor (e.g., a polycrystalline semiconductor (P-Si)) may be positioned on the buffer layer 111. The first semiconductor layer ACT(P-Si) may include a channel of a polycrystalline transistor LTPS TFT including a driving transistor, and a first region and a second region positioned on respective sides thereof. Here, the polycrystalline transistor LTPS TFT may include switching transistors in addition to the driving transistor. Further, the respective sides of the channel of the first semiconductor layer ACT(P-Si) may have regions having a conductive layer characteristic according to plasma processing or doping and may function as a first electrode and a second electrode of the transistor.

A first gate insulating layer 141 may be positioned on the first semiconductor layer ACT(P-Si). The first gate insulating layer 141 may be an inorganic insulating layer including a silicon oxide (SiOx), a silicon nitride (SiNx), and/or a silicon oxynitride (SiOxNy).

A first gate conductive layer including a gate electrode GAT1 of the polycrystalline transistor LTPS TFT may be positioned on the first gate insulating layer 141. A scan line or a light emitting control line may be formed on the first gate conductive layer in addition to the gate electrode GAT1 of the polycrystalline transistor LTPS TFT. The first gate conductive layer may include a metal such as copper (Cu), molybdenum (Mo), aluminum (Al), or titanium (Ti), or their metal alloys, and may be configured to be a single layer or a multilayer.

The first gate conductive layer may be formed, and the plasma processing or the doping process may be performed to make the exposed region of the first semiconductor layer conductive. For example, the first semiconductor layer ACT (P-Si) covered by the first gate conductive layer may not be made conductive, and a portion of the first semiconductor layer ACT(P-Si) that is not covered by the first gate conductive layer may have the same characteristic as the conductive layer.

A second gate insulating layer 142 may be positioned on the first gate conductive layer and the first gate insulating layer 141. The second gate insulating layer 142 may be an inorganic insulating layer including a silicon oxide (SiOx), a silicon nitride (SiNx), and a silicon oxynitride (SiOxNy).

A second gate conductive layer GAT2 including a first electrode GAT2(Cst) of a storage capacitor Cst and a lower shielding layer GAT2(BML) of an oxide transistor Oxide TFT may be positioned on the second gate insulating layer 142. The lower shielding layer GAT2(BML) of the oxide transistor Oxide TFT may be positioned on the lower portion of the channel of the oxide transistor Oxide TFT and may shield from beams or electromagnetic interference provided to the channel from the lower side. The first electrode GAT2(Cst) of the storage capacitor Cst may overlap a gate electrode GAT1 of the driving transistor to configure the storage capacitor Cst. Depending on embodiments, the second gate conductive layer GAT2 may further include a scan line, a control line, or a voltage line. The second gate conductive layer GAT2 may include a metal such as copper (Cu), molybdenum (Mo), aluminum (Al), titanium (Ti), and/or their metal alloys, and may be configured to be a single layer or a multilayer.

A first interlayer insulating layer 161 may be positioned on the second gate conductive layer GAT2. The first interlayer insulating layer 161 may include an inorganic insulating layer including a silicon oxide (SiOx), a silicon nitride (SiNx), and/or a silicon oxynitride (SiOxNy), and depending on embodiments, the inorganic insulating material may be made thick.

An oxide semiconductor layer (ACT2(IGZO) (also referred to as a second semiconductor layer) including the channel of the oxide transistor Oxide TFT, the first region, and the second region may be positioned on the first interlayer insulating layer 161.

A third gate insulating layer 143 may be positioned on the oxide semiconductor layer ACT2(IGZO). The third gate insulating layer 143 may be positioned on the oxide semiconductor layer ACT2(IGZO) and the entire surface of the first interlayer insulating layer 161. The third gate insulating layer 143 may include an inorganic insulating layer including a silicon oxide (SiOx), a silicon nitride (SiNx), and a silicon oxynitride (SiOxNy).

A third gate conductive layer including a gate electrode GAT3 of the oxide transistor Oxide TFT may be positioned on the third gate insulating layer 143. The gate electrode GAT3 of the oxide transistor Oxide TFT may overlap the channel. The third gate conductive layer may further include a scan line or a control line. The third gate conductive layer may include a metal such as copper (Cu), molybdenum (Mo), aluminum (Al), titanium (Ti), and/or their metal alloys, and may be configured to be a single layer or a multilayer.

A second interlayer insulating layer 162 may be positioned on the third gate conductive layer. The second interlayer insulating layer 162 may have a single-layered or multi-layered structure. The second interlayer insulating layer 162 may include an inorganic insulating material such as a silicon nitride (SiNx), a silicon oxide (SiOx), and/or a silicon oxynitride (SiOxNy), and it may include an organic material depending on embodiments.

A first data conductive layer SD1 including a connecting member to be connected to the first regions and the second regions of the polycrystalline transistor LTPS TFT and the oxide transistor Oxide TFT may be positioned on the second interlayer insulating layer 162. The first data conductive layer SD1 may include a metal such as aluminum (Al), copper (Cu), molybdenum (Mo), titanium (Ti), and/or their metal alloys, and may be configured to be a single layer or a multilayer.

A first organic layer 181 may be positioned on the first data conductive layer SD1. The first organic layer 181 may be an organic insulator including an organic material, and the organic material may include at least one material of polyimide, polyamide, acryl resin, benzocyclobutene, and phenol resin.

A second data conductive layer including a first electrode connecting member ACM2 may be positioned on the first organic layer 181. The second data conductive layer may include a data line or a driving voltage line. The second data conductive layer may include a metal such as aluminum (Al), copper (Cu), molybdenum (Mo), titanium (Ti), and/or their metal alloys, and may be configured to be a single layer or a multilayer. The first electrode connecting member ACM2 may be connected to the first data conductive layer SD1 through the opening OP3 positioned in the first organic layer 181.

The second organic layer 182 and the third organic layer 183 may be positioned on the second data conductive layer, and a first electrode connecting opening OP4 may be formed in the second organic layer 182 and the third organic layer 183. The first electrode connecting member ACM2 may be electrically connected to the first electrode (or an anode) through the first electrode connecting opening OP4. The second organic layer 182 and the third organic layer 183 may be organic insulators, and may include at least one material of polyimide, polyamide, acryl resin, benzocyclobutene, and phenol resin. The third organic layer 183 may be omitted depending on embodiments.

A cell barrier 380 having an opening OP for exposing the first electrode (or the anode) and covering at least part of the first electrode (or the anode) may be positioned on the first electrode (or the anode). The cell barrier 380 may be a black cell barrier made of a black organic material and preventing light applied from the outside from being reflected to the outside, and may be made of a transparent organic material depending on embodiments. Therefore, depending on embodiments, the cell barrier 380 may include a negative-type black organic material, and may include a black pigment.

A spacer 385 may be positioned on the cell barrier 380. The spacer 385 may be made of a transparent organic insulating material, differing from the cell barrier 380. Depending on embodiments, the spacer 385 may be made of a positive-type transparent organic material. The spacer 385 may include two portions 385-1 and 385-2 with different heights, and the higher portion 385-1 may function as a spacer, while the lower portion 385-2 may improve an adhering characteristic between the spacer and the cell barrier 380.

A functional layer FL and a second electrode (or a Cathode) may be sequentially formed on the first electrode (or the Anode), the spacer 385, and the cell barrier 380, and the functional layer FL and the second electrode (or the Cathode) may be positioned in the entire region. The emission layer EML may be positioned between the functional layer FL, and the emission layer EML may be positioned in the opening OP of the cell barrier 380. A combination of the functional layer FL and the emission layer EML may be referred to as an intermediate layer. The functional layer FL may include at least one of auxiliary layers such as the electron injection layer, the electron transport layer, the hole transport layer, and the hole injection layer, and the hole injection layer and the hole transport layer may be positioned on the lower portion of the emission layer EML, while the electron transport layer and the electron injection layer may be positioned on the upper portion of the emission layer EML.

An encapsulation layer 400 may be positioned on the second electrode (or the cathode). The encapsulation layer 400 may include at least one inorganic layer and at least one organic layer, and as shown in the embodiment given with reference to FIG. 4, it may have a triple-layered structure including a first inorganic encapsulation layer, an organic encapsulation layer, and a second inorganic encapsulation layer. The encapsulation layer 400 may protect the emission layer EML from moisture or oxygen that may be input from outside. Depending on embodiments, the encapsulation layer 400 may include a structure in which the inorganic layer and the organic layer are sequentially stacked on each other.

While this disclosure has been described in connection with what is considered to be practical embodiments, it is to be understood that the disclosure is not limited to the disclosed embodiments, but, on the contrary, is intended to cover various modifications and equivalent arrangements.

What is claimed is:

1. A display device comprising:
a light emitting diode disposed on a substrate, and including an emission layer;
an encapsulation layer disposed on the light emitting diode;
a first layer disposed on the encapsulation layer and including an opening;
a light blocking pattern disposed in the opening and extending in a first direction; and
a second layer disposed on the first layer and the light blocking pattern, wherein
a refractive index of the first layer and a refractive index of the second layer are different from each other, and
an upper side of the light blocking pattern is concave.

2. The display device of claim 1, wherein the opening includes a first opening and a second opening extended to each other, and
an area of an upper portion of the first opening is equal to or greater than an area of a lower portion of the second opening.

3. The display device of claim 2, wherein the light blocking pattern includes:
a first light blocking pattern disposed in the first opening; and
a second light blocking pattern disposed in the second opening, and
the first light blocking pattern and the second light blocking pattern are integral with each other.

4. The display device of claim 3, wherein an upper side of the second light blocking pattern has a concave shape.

5. The display device of claim 4, wherein part of the second layer is disposed in the second opening.

6. The display device of claim 1, wherein the refractive index of the first layer is greater than the refractive index of the second layer.

7. The display device of claim 1, wherein the refractive index of the second layer is greater than the refractive index of the first layer.

8. The display device of claim 2, wherein the light blocking pattern includes a first light blocking pattern disposed in the first opening, and
part of the second layer is disposed in the second opening.

9. The display device of claim 2, wherein the display device further includes a metal layer disposed in the second opening.

10. The display device of claim 9, wherein the metal layer is formed on an internal side of the second opening.

11. The display device of claim 9, wherein the metal layer includes molybdenum.

12. A display device comprising:
a light emitting diode disposed on a substrate and including an emission layer;
an encapsulation layer disposed on the light emitting diode;
a first layer disposed on the encapsulation layer and including a first opening;
a linear pattern disposed in the first opening and extending in a first direction;
a light blocking pattern disposed on the linear pattern and extending in the first direction; and
a second layer disposed on the first layer and the light blocking pattern, wherein
a refractive index of the first layer and a refractive index of the second layer are different from each other, and
an upper side of the light blocking pattern is concave.

13. The display device of claim 12, wherein an opening includes the first opening and a second opening extended to each other,
the linear pattern is disposed in the first opening, and
the light blocking pattern is disposed in the second opening.

14. The display device of claim 12, wherein the refractive index of the first layer is greater than the refractive index of the second layer.

15. The display device of claim 12, wherein the refractive index of the second layer is greater than the refractive index of the first layer.

* * * * *